(12) United States Patent
Ling et al.

(10) Patent No.: US 12,027,981 B2
(45) Date of Patent: Jul. 2, 2024

(54) RIPPLE SUPPRESSION IN MULTI-PHASE BUCK CONVERTERS

(71) Applicant: MAXLINEAR, INC., Carlsbad, CA (US)

(72) Inventors: Curtis Ling, Carlsbad, CA (US); Shantha Murthy Prem Swaroop, Carlsbad, CA (US); Vinit Jayaraj, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 207 days.

(21) Appl. No.: 17/403,765

(22) Filed: Aug. 16, 2021

(65) Prior Publication Data

US 2022/0166323 A1 May 26, 2022

Related U.S. Application Data

(63) Continuation of application No. 16/665,563, filed on Oct. 28, 2019, now Pat. No. 11,095,223.

(60) Provisional application No. 62/751,305, filed on Oct. 26, 2018.

(51) Int. Cl.
*H02M 3/158* (2006.01)
*H02M 3/156* (2006.01)
*H03M 1/14* (2006.01)

(52) U.S. Cl.
CPC ......... *H02M 3/1584* (2013.01); *H02M 3/156* (2013.01); *H02M 3/1586* (2021.05); *H03M 1/143* (2013.01)

(58) Field of Classification Search
CPC .. H02M 3/1582; H02M 3/156; H02M 3/1584; H02M 3/1586; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/08; H02M 3/1588; H02M 7/5395; H02M 1/14; H02J 3/46; H02J 3/38
See application file for complete search history.

(56) References Cited

U.S. PATENT DOCUMENTS 5,668,464 A * 9/1997 Krein ...................... G05F 1/565
363/46
6,583,610 B2 * 6/2003 Groom .................. H02M 3/156
323/224

(Continued)

*Primary Examiner* — Jeffrey A Gblende
(74) *Attorney, Agent, or Firm* — Buchalter; Jason W. Croft

(57) ABSTRACT

Methods and systems for ripple suppression in multi-phase buck converters may comprise a buck converter for providing an output voltage with controlled ripple current. The buck converter may include one or more main buck converter stages and one or more suppression buck converter stages coupled with the one or more main buck converter stages. The one or more suppression buck converter stages may provide suppression currents to reduce ripple currents generated in the one or main buck converter stages.

17 Claims, 12 Drawing Sheets

(56) References Cited

U.S. PATENT DOCUMENTS

| | | | |
|---|---|---|---|
| 7,142,440 B2 * | 11/2006 | de Rooij | H02M 1/14 |
| | | | 363/39 |
| 8,384,365 B2 | 2/2013 | Maksimovic et al. | |
| 9,577,508 B2 * | 2/2017 | Wang | H02M 1/15 |
| 9,941,795 B1 | 4/2018 | Mayega et al. | |
| 10,298,114 B1 * | 5/2019 | Yazdi | H02M 1/15 |
| 11,095,223 B2 * | 8/2021 | Ling | H02M 3/156 |
| 2011/0133704 A1 * | 6/2011 | Zambetti | H02M 3/1584 |
| | | | 323/212 |
| 2015/0097542 A1 * | 4/2015 | Repton | H02M 3/1584 |
| | | | 323/282 |
| 2017/0373594 A1 | 12/2017 | Childs | |
| 2020/0136637 A1 | 4/2020 | Ing et al. | |

* cited by examiner

RIPPLE SUPPRESSION IN MULTI-PHASE BUCK CONVERTERS

CLAIM OF PRIORITY

This application is a continuation of U.S. patent application Ser. No. 16/665,563, filed on Oct. 28, 2019, which claims priority to U.S. Provisional Patent Application Ser. No. 62/751,305, filed on Oct. 26, 2018, each of which are hereby incorporated herein by reference in their entireties.

TECHNICAL FIELD

Certain embodiments of the invention relate to power management. More specifically, certain embodiments of the invention relate to ripple suppression in multi-phase buck converters.

BACKGROUND

All electronic systems have some form of power management, and most all systems have DC-to-DC voltage conversion. Typical conversion systems are bulky and inefficient.

Further limitations and disadvantages of conventional and traditional approaches will become apparent to one of skill in the art, through comparison of such systems with the present invention as set forth in the remainder of the present application with reference to the drawings.

BRIEF SUMMARY

A system and/or method is provided for ripple suppression in multi-phase buck converters, substantially as shown in and/or described in connection with at least one of the figures, as set forth more completely in the claims.

These and various other advantages, aspects and novel features of the present invention, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
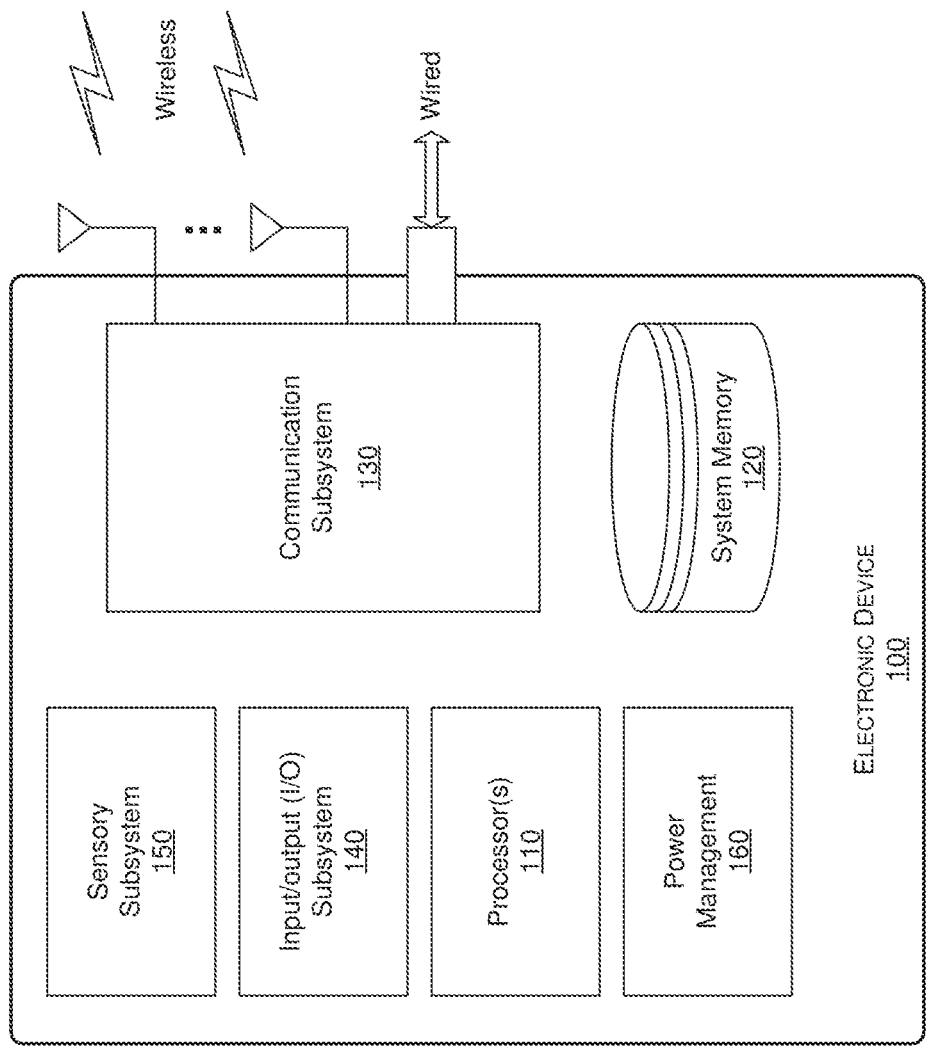
FIG. 1 illustrates an example electronic device that utilizes ripple suppression in multi-phase buck converters, which may be used in accordance with various implementations of the disclosure.

FIG. 1 illustrates an example electronic device that utilizes ripple suppression in multi-phase buck converters, which may be used in accordance with various implementations of the disclosure. Referring to FIG. 1, there is shown an electronic device 100.

The electronic device 100 may comprise suitable circuitry, interfaces, logic, and/or code for implementing various aspects of the disclosure. In this regard, the electronic device 100 may be configured to support performing, executing or running various operations, functions, applications and/or services. For example, the electronic device 100 may be operable to support, in some instances, such operations as communication operations, processing or handling of data, input/output operations, power management, or the like. In this regard, the electronic device 100 may enable and/or support communication of data, such as via wired and/or wireless connections, which may be configured in accordance with one or more supported wireless and/or wired protocols or standards.

To support input/output operations, the electronic device 100 may comprise components or subsystems for enabling interactions with a user (e.g., end-user or installer), so as to obtain user input and/or to provide user output. In some instances, the electronic device 100 may be a handheld mobile device—i.e., be intended for use on the move and/or at different locations. In this regard, the electronic device 100 may be designed and/or configured to allow for ease of movement, such as to allow it to be readily moved while being held by the user as the user moves, and the electronic device 100 may be configured to perform at least some of the operations, functions, applications and/or services supported by the device on the move. Examples of electronic devices may comprise servers, set-top boxes, televisions, displays, gateways, modems, access points, femtocells, computers, cellular phones, smartphones, tablets, and or any other network node. The disclosure, however, is not limited to any particular type of electronic device.

The electronic device 100 may comprise, for example, one or more processors 110, a system memory 120, a communication subsystem 130, an input/output (I/O) subsystem 140, a sensory subsystem 150, and power management system.

The processor 110 may comprise suitable circuitry, interfaces, logic, and/or code that may be operable to perform general and/or specialized processing operations in the electronic device 110. For example, the processor 110 may comprise a general purpose processor (e.g., a central processing unit or CPU), a special purpose processor (e.g., graphics processing unit or GPU, or a visual processing unit or VPU), or the like. The disclosure, however, is not limited to any particular type of processor. When utilized as a general purpose processor, the processor 110 may be operable to, for example, process or handle data, control or manage operations of the electronic device 100, and/or handle or support tasks and/or applications performed therein. In this regard, the processor 110 may be utilized to configure and/or control operations of various components and/or subsystems of the electronic device 100, by utilizing, for example, one or more control signals. In some instances, however, the processor 110 may comprise a specialized processor, such as a video/graphics processor or a dedicated application processor that may be utilized for running and/or executing applications (or programs) in the electronic device 100.

The system memory 120 may comprise suitable circuitry, interfaces, logic, and/or code that may enable permanent and/or non-permanent storage, buffering, and/or fetching of data, code and/or other information, which may be used, consumed and/or processed. In this regard, the system memory 120 may comprise different memory technologies, including, for example, read-only memory (ROM), random access memory (RAM), Flash memory, solid-state drive (SSD), and/or field-programmable gate array (FPGA). The disclosure, however, is not limited to any particular type of memory or storage device. The system memory 120 may store, for example, configuration data, which may comprise parameters and/or code, comprising software and/or firmware. The disclosure is not limited, however, to any particular type of configuration data.

The communication subsystem 130 may comprise suitable circuitry, interfaces, logic, and/or code operable to communicate data from and/or to the electronic device, such as via one or more wired and/or wireless connections. The communication subsystem 130 may be configured to support one or more wired protocols and/or interfaces, and/or one or more wireless protocols and/or interfaces, facilitating transmission and/or reception of signals to and/or from the electronic device 100 and/or processing of transmitted or received signals in accordance with applicable wired or wireless protocols. Examples of wireless protocols or standards that may be supported and/or used by the communication subsystem 130 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 1G/2G+ (e.g., GSM/GPRS/EDGE, and IS-95 or cdmaOne) and/or 1G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 130 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the communication subsystem 130 comprise, for example, filtering, amplification, analog-to-digital conversion and/or digital-to-analog conversion, up-conversion/down-conversion of baseband signals, encoding/decoding, encryption/decryption, and/or modulation/demodulation.

The I/O subsystem 140 may comprise suitable circuitry, interfaces, logic, and/or code for enabling and/or managing user (e.g., end-user or installer) interactions with the electronic device 100, such as obtaining input from, and/or to providing output to, the device user(s). The I/O subsystem 140 may support various types of inputs and/or outputs, including, for example, video, audio, and/or text. In this regard, dedicated I/O devices and/or components, external to (and coupled with) or integrated within the electronic device 100, may be utilized for inputting and/or outputting data during operations of the I/O subsystem 140. Examples of such dedicated I/O devices may comprise displays, audio I/O components (e.g., speakers and/or microphones), mice, keyboards, touch screens (or touchpads), and the like. In some instances, user input obtained via the I/O subsystem 140, may be used to configure and/or modify various functions of particular components or subsystems of the electronic device 100.

The sensory subsystem 150 may comprise suitable circuitry, interfaces, logic, and/or code for obtaining and/or generating sensory information, which may relate to the electronic device 100, its user(s), and/or its environment. For example, the sensory subsystem 150 may comprise ambient conditions (e.g., temperature, humidity, or light) sensors, positional or location sensors (e.g., GPS or other GNSS based sensors), and/or motion related sensors (e.g., accelerometer, gyroscope, pedometers, and/or altimeters).

The power management system 160 may comprise circuitry for controlling the various voltages required by the electronic device. For example, if the electronic device receives an input AC voltage, the power management system 160 may comprise rectification and filtering capability to generate a DC voltage. Additionally, the power management system 160 may comprise DC-to-DC voltage conversion circuitry, to generate various DC voltages used in the electronic device 100. Some systems, such as the communication subsystem 130 may use higher DC voltages of 5-10 Volts or more, for example, while other circuitry may use lower DC voltages on the order of 1 or 2 Volts. One technique for generating these voltages is a buck converter, which in its simplest form comprises a switched inductor and a capacitor in parallel with a load coupled to its output.

Multi-phase buck converters with ripple suppression are discussed further with respect to FIGS. 2-10.

In operation, the electronic device 100 may be utilized (e.g., by a user) to perform, execute and/or run various operations, functions, applications or services, such as using pre-configured instructions and/or based on real-time user instructions or interactions. In this regard, various types of operations, functions, applications or services may be available in or supported by the electronic device 100. For example, the electronic device 100 may be used for executing programs, playing video and/or audio content, gaming, email applications (and/or similar type of web based communications), calling services (e.g., voice calls), networking services (e.g., WiFi hotspot, Bluetooth piconet, and/or active 3G/femtocell data channels), or the like. The disclosure, however, is not limited to any particular type of operations, functions, applications or services.

Various operations performed by the electronic device 100 often require different DC voltages in different circuits. The power management system 160 may generate −1 Volt supply voltages for high-speed processor circuitry while also supplying higher voltages to RF signal generation circuitry. In addition, these different voltage needs may change intermittently depending on usage, for example. These voltages need to change accurately as well as quickly so as not to adversely affect operation of the electronic device 100, which may be performed by buck converters, as discussed with respect to FIGS. 2-10. Furthermore, these voltages need to remain constant for better performance of the electronics, with minimal ripple. A conventional buck converter may generate an excessive amount of ripple. This drawback may be mitigated through the use of harmonic suppression buck converters, as disclosed below.

Figure 2:
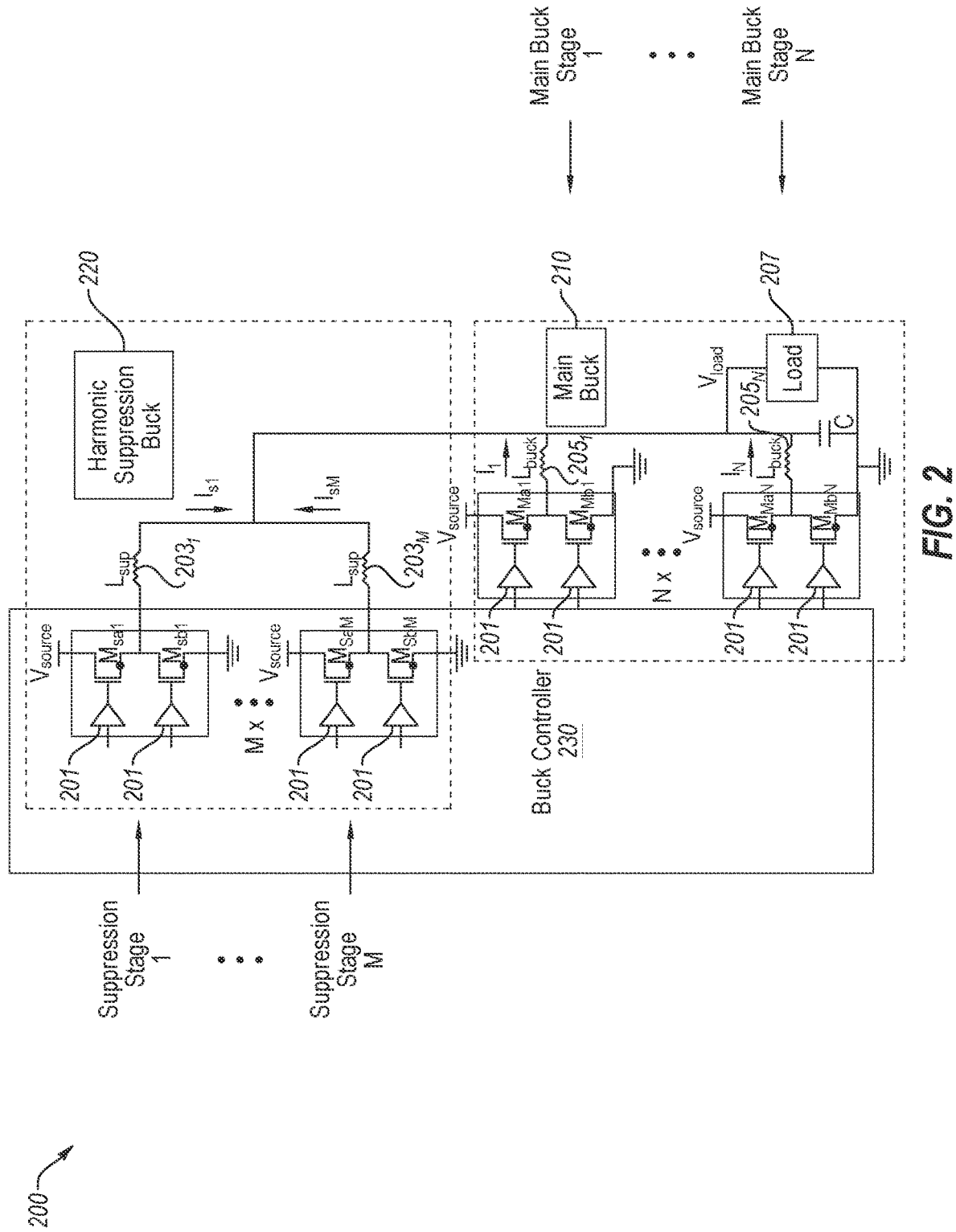
FIG. 2 is a block diagram illustrating an example multi-phase buck converter, which may be used in accordance with various implementations of the disclosure.

FIG. 2 is a block diagram illustrating an example multi-phase buck converter, which may be used in accordance with various implementations of the disclosure. Referring to FIG. 2, there is shown a multi-phase buck converter 200 comprising a main buck converter 210 and harmonic suppression buck converter 220. Each of the buck converters 210 and 220 may comprise a plurality of stages, N stages for the main buck converter 210, and M stages for the harmonic suppression buck converter 220, for example, with main buck currents li-IN and suppression buck currents Isi-Ism. Each stage may comprise a pair of switches, NMOS transistors in this example, although other types of switches are possible, and an inductor Lsup 2031-203M or Lbuck 2051-205N. There is also shown an input stage 201 for each buck converter stage, which provides control signals for each of the switches Msai/Msbi-Msam/Msbm and m-Mal, -Mbl-MMaN/MMbN. The input stages 201 may comprise clock generators, PLLs, amplifiers, filters, etc. for generating signals to switch each of the transistors Msai/Msbi-Msam/Msbm and Mmai/Mmbi-MMaN/MMbN on and off.

The main buck converter 210 may comprise a capacitor C that receives and output charge depending on the voltage across it with respect to Vload, the output voltage coupled to the load 207. Each of the stages in the main and harmonic suppression buck converters 210 and 220 may have a supply voltage Vsource at the drain terminal of the MOS transistors Msai-Msam and M-Mal-MMaN, and the source terminal of the transistors Msbi-Msbm and MMbi-MMbN of each MOS pair may be coupled to ground, while the remaining source and drain terminals may be coupled together and to the corresponding output inductor, Lsup 2011-203m or Lbuck 2051-205N.

In a buck converter, ripple in the output voltage is inversely proportional to the number of phases N and inductance L and capacitance C. For low ripple, a large number of phases with large L and C may be needed. However, large L and C result in slow transient response, as the low-side switch cannot remove charge very fast and limits performance of dynamic voltage and frequency scaling (DVFS) as well as envelope tracking. Furthermore, large L and C are expensive, nonlinear, and lossy. A large L requires a high-1.1 core, which has a B-H curve, so the actual inductance is dependent on current. Finally, large L and C require a large amount of space on the circuit board, chip, or package. Therefore, it is advantageous to develop architectures that can reduce L and C while still meeting ripple specifications. Such a structure should achieve faster transient tracking, higher efficiency, lower cost, and smaller board area.

In a multi-phase, N-stage buck converter, the output current comprises a large total current with strong N-th harmonics, such that an N-phase buck converter switching at fawitbb will produce harmonics at N×fawitbb. In an example scenario, an additional low-current "suppression buck" converter at N×fawitbb may be utilized to cancel the N-th harmonic currents. The low currents in the harmonic suppression buck (HSB) converter 220 allow the use of integrated driver MOS switches with low-cost/small passive devices. The suppression buck 220 may have a different number of phases, M phases, as shown in FIG. 2. These M phases allow synthesis of the necessary suppression waveform to cancel a significant part of the ripple current.

The HSB converter 220 may provide zero or near-zero net DC current to the load with a very low RMS current. Because of the low currents, the MOS switches Msai/Msbi-Msam/Msbm may be fully integrated on-chip, comprising integrated driver-MOS switches, as opposed to requiring large off-chip devices. In an example embodiment, the HSB buck 220 may be integrated on-chip with circuitry of the buck controller 230. Some of the devices may be off-chip, such as the inductors Lsup 2031-203M and Lbuck, 2051-205N. However, any and all devices may be on-chip, depending on current requirements of the buck converter 200 and space available on the chip.

The main buck converter 210 may source all the DC current of the buck converter 200, with the transistors I\AMal, -"-Mbl-MMaN/MMbN comprising off-chip high-current high-performance driver MOS transistors. In an example scenario, each phase of the HSB converter 220 may be triggered sequentially with equally spaced phase and the switching frequency being M x the frequency of the main buck converter 210. In this manner, each of the M phases of the HSB converter 220 may provide a ripple suppression current for a portion of the main buck converter 210 cycle.

Figure 3:
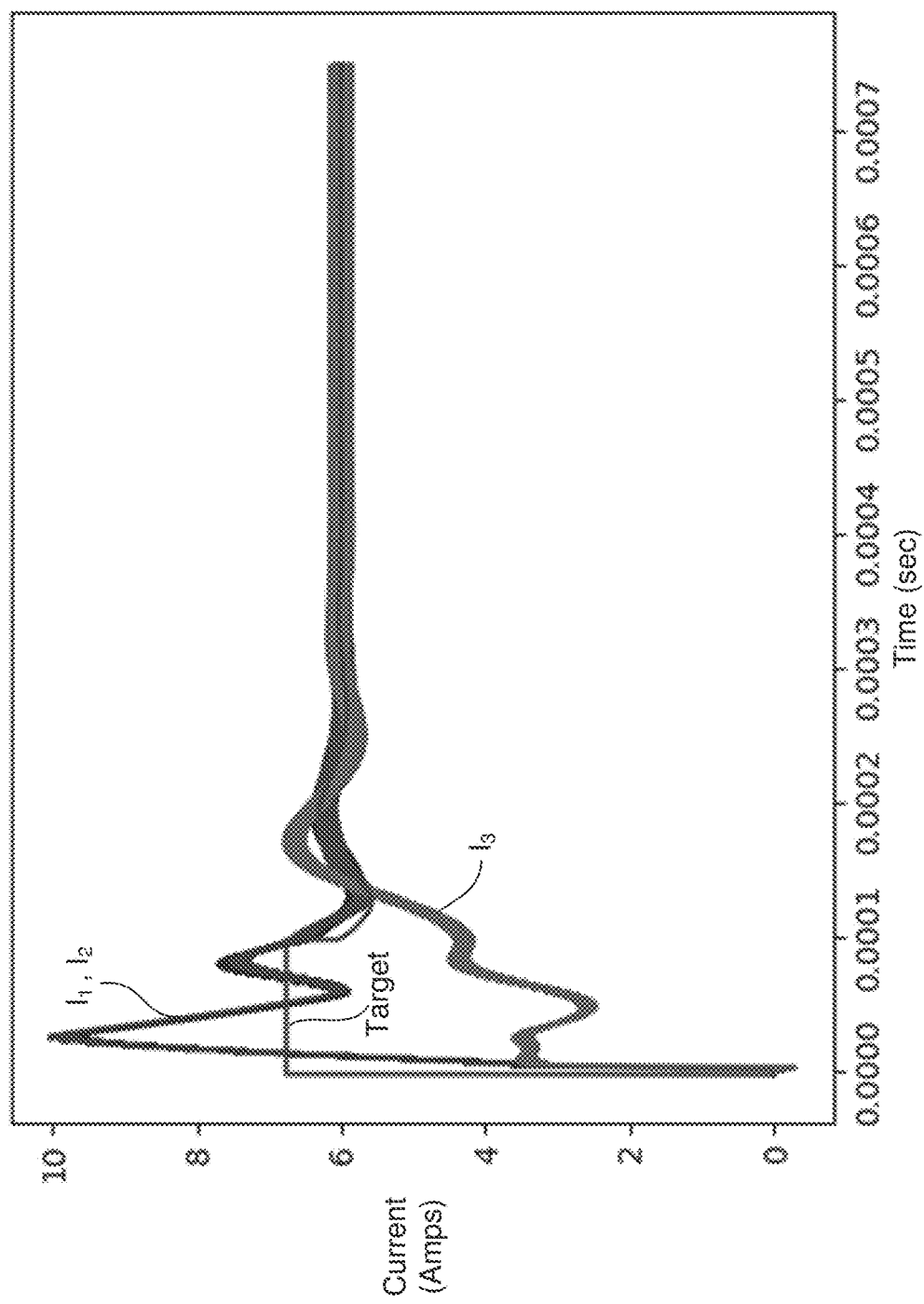
FIG. 3 illustrates modeled current of a multi-phase buck converter, in accordance with an example embodiment of the disclosure.

FIG. 3 illustrates modeled current of a multi-phase buck converter, in accordance with an example embodiment of the disclosure. Referring to FIG. 3, there is shown current plots for each phase of a 3-phase buck converter with a target of 6 Amps per phase. In addition, there is shown the target current. As can be seen in the plot, the 11 and 12 phase currents track positive (above target) initially while the 13 phase current is below target, and there is some ringing of the current in each phase as they stabilize to the target current of 6 A/phase.

Figure 4:
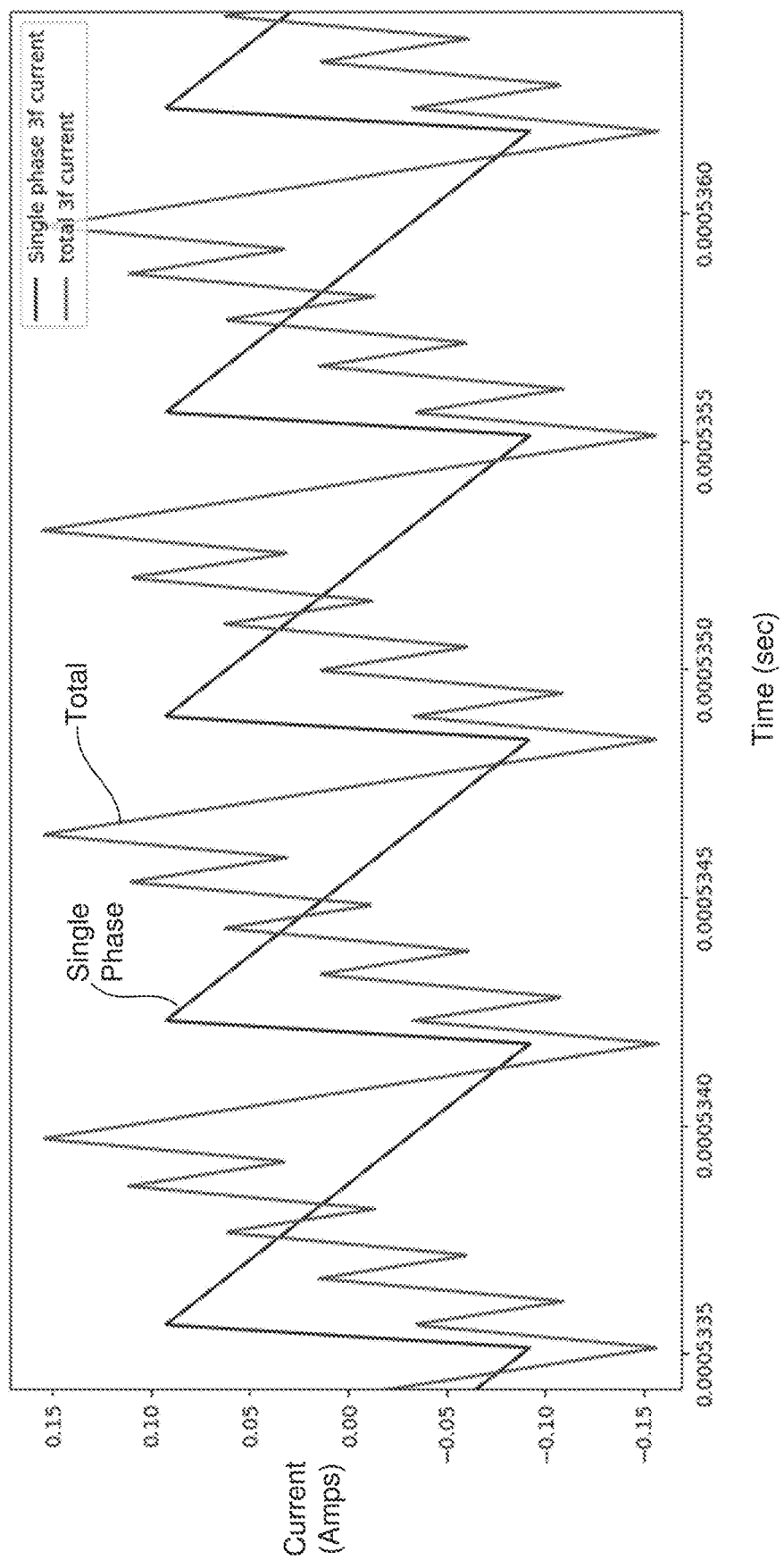
FIG. 4 illustrates simulated currents in main and ripple suppression buck converters, in accordance with an example embodiment of the disclosure.

FIG. 4 illustrates simulated currents in main and ripple suppression buck converters, in accordance with an example embodiment of the disclosure. Referring to FIG. 4, there is shown a sawtooth shaped current from the main 3-phase buck converter (N=3) and a more jagged sawtooth shaped current from a 5-phase (M=5) harmonic suppression buck, as shown in FIG. 2. As can be seen by comparing the currents, the HSB current largely offsets the ripple of the main buck converter, with some "discreteness" due to the finite number of phases. This can be improved by increasing the number of phases, or tuning the current slope in the HSB converter phases.

Figure 5:
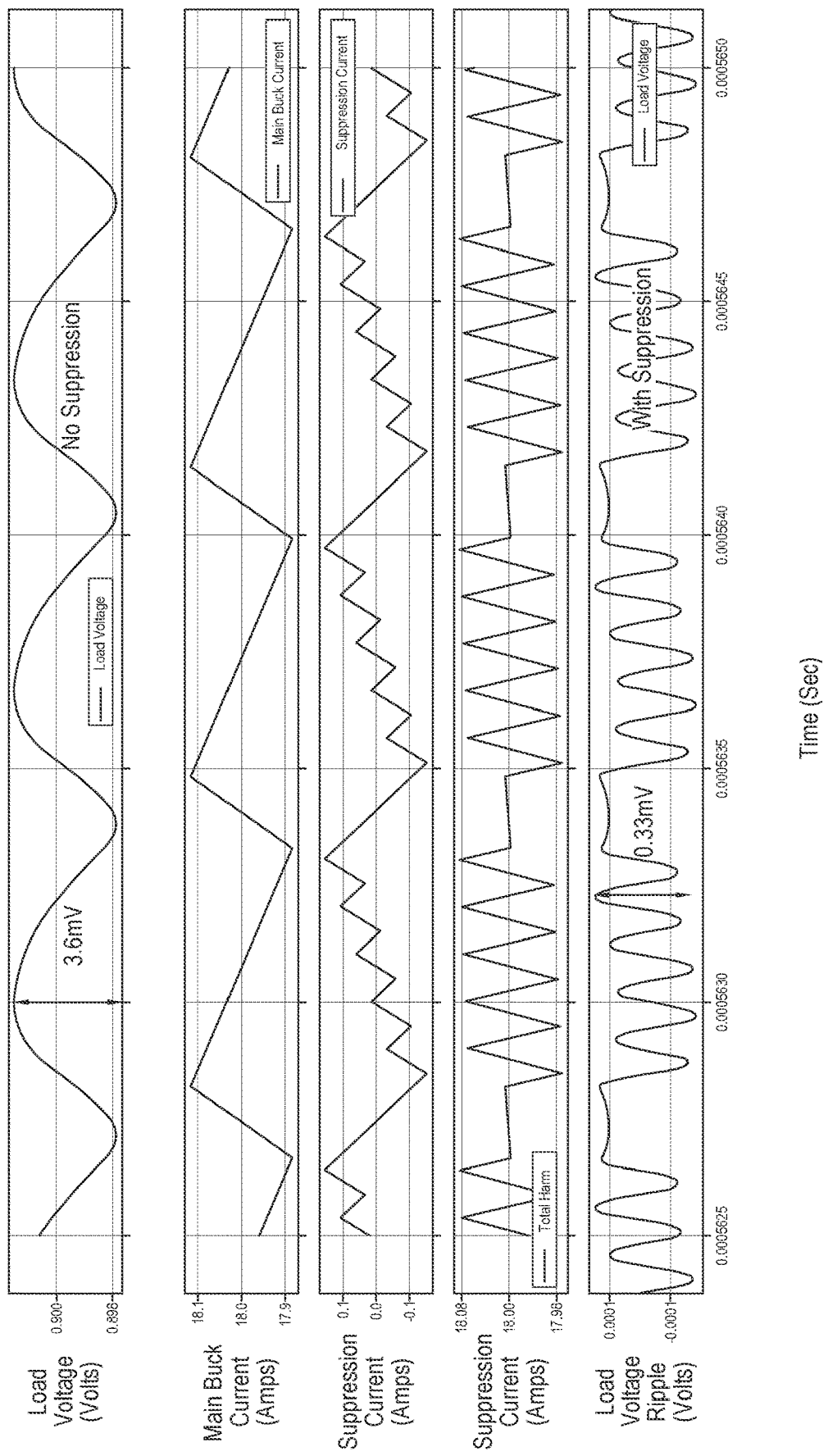
FIG. 5 illustrates various currents and voltages in a multi-phase buck converter with and without harmonic suppression, in accordance with an example embodiment of the disclosure.

FIG. 5 illustrates various currents and voltages in a multi-phase buck converter with and without harmonic suppression, in accordance with an example embodiment of the disclosure. Referring to FIG. 5, there is shown load voltage ripple for a multi-phase buck converter with no suppression, current from the main buck converter with no suppression, harmonic suppression buck converter current, 5-phase harmonic suppression buck converter current, total current comprising a sum of the main buck converter current and HSB converter current, and load voltage ripple with suppression. As can be seen by comparing the main buck converter current and the HSB converter current, the peaks and valleys are essentially 180 degrees out of phase, so that most of the ripple current is suppressed, as indicated by the summed current plot, second from the bottom. The load voltage ripple with suppression in the last plot shows that the output voltage has about 0.33 mV ripple as compared to the 3.6 mV ripple without suppression in the top plot, thereby demonstrating a 10-fold improvement in ripple.

Figure 6:
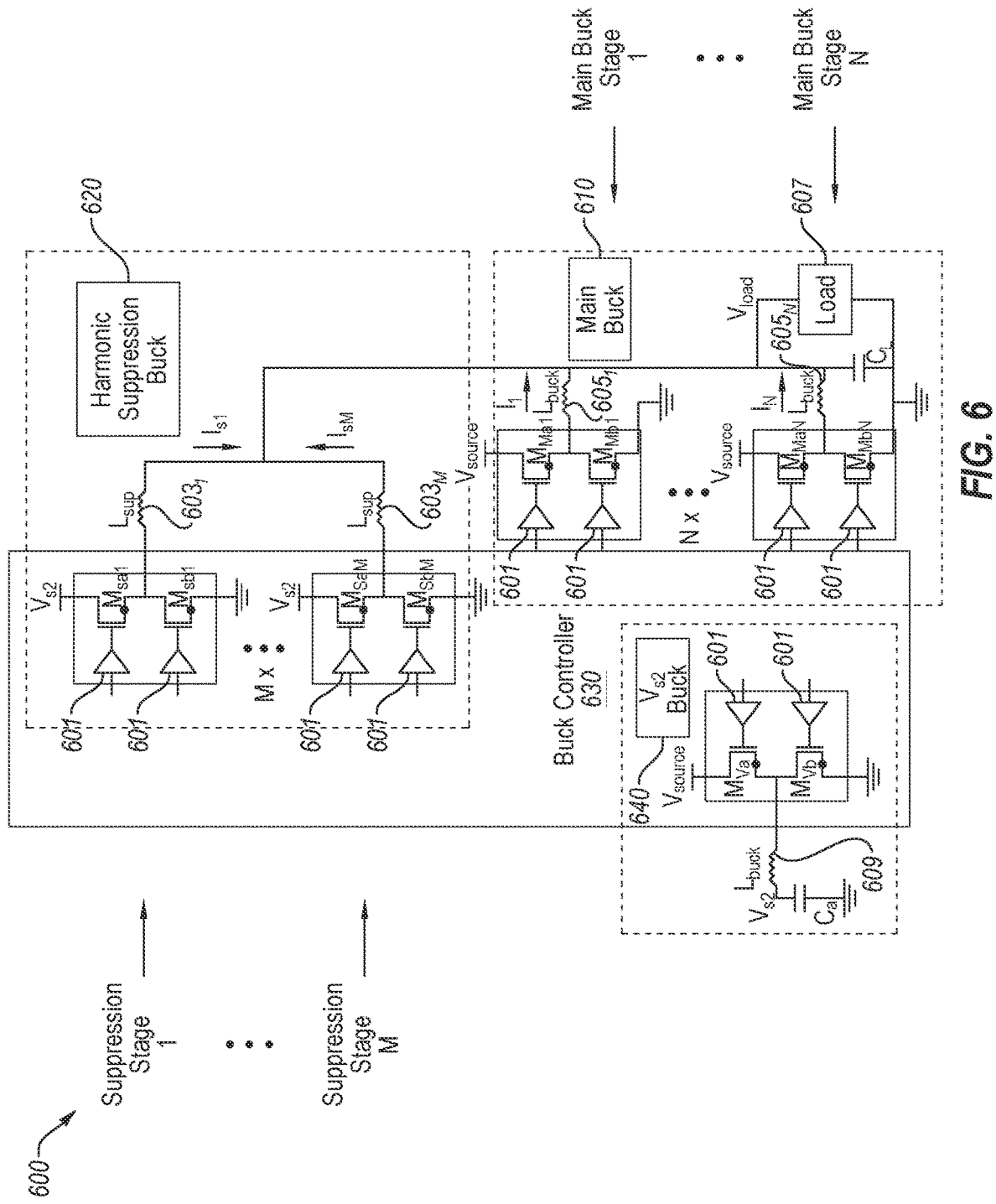
FIG. 6 illustrates a multi-phase buck converter with harmonic suppression and intermediate supply voltage, in accordance with an example embodiment of the disclosure.

FIG. 6 illustrates a multi-phase buck converter with harmonic suppression and intermediate supply voltage, in accordance with an example embodiment of the disclosure. Referring to FIG. 6, there is shown a multi-phase buck converter 600 comprising a main buck converter 610, a harmonic suppression buck converter 620, and an intermediate supply voltage buck converter 640. The buck converters 610 and 620 may comprise a plurality of stages or phases, N phases for the main buck converter 610, and M phases for the harmonic suppression buck converter 620, for example, with main buck currents li-lN and suppression buck currents Isi-Ism. As with the buck converter in FIG. 2, each stage may comprise a pair of switches, NMOS transistors in this example, although other types of switches are possible, and an inductor Lsup 6031-603M or Lbuck 6051-605N. There is also shown an input stage 601 for each buck converter stage, which provides control signals for each of the switches Msai/Msbi-Msam/Msbm and -Malm MA, -Mbl-MMaN/MMbN, and Mva/Mvb. The input stages 601 may comprise clock generators, PLLs, amplifiers, filters, etc. for generating signals to switch each of the transistors Msai/Msbi MSaM/MSbM and MMal/MMbl-MMaN/MMbN on and off.

The main buck converter 610 may comprise a capacitor CL that may receive and output charge depending on the voltage across it with respect to Vload, the output voltage coupled to the load 607. The main buck converter 610 may have a supply voltage Vsource at the drain terminal of transistors M-Mal-MMaN of the MOS transistors in the converter 610, and the source of the other transistors MMbl-MMbN of each MOS pair may be coupled to ground, while the remaining source and drain terminals may be coupled together and to the corresponding output inductor, Lbuck 6051-605N. In this example, the HSB converter 620 may have a different intermediate supply voltage, Vs2, coupled to the drain terminals of transistors Msai-Msam and the source terminals of transistors Msbi-Msbm of the MOS pairs may be coupled to ground, while the remaining source and drain terminals may be coupled together and to the corresponding output inductor, Lsup 6031-605m.

This intermediate voltage Vs2 may be less than Vsource and larger than the minimum voltage, which is ground in this example, although negative voltages may also be used for the low voltage. The voltage Vs2 may be generated by the intermediate supply voltage buck converter 640, which may step the supply voltage Vsource, down to a voltage closer to the desired output at the load. In this example, using the intermediate voltage where Vs2<Vsource, the HSB converter 620 has a higher duty cycle and better slope matching to the main buck 610. With improved slope matching, between the main ripple current and ripple suppression current, fewer HSB phases may be needed, which reduces system complexity for a given ripple current. The intermediate voltage Vs2 may be chosen to exactly match HSB and main buck current slopes for optimal cancellation, which can then be performed with M=1.

The intermediate voltage Vs2 may be efficiently generated using a switching regulator, as shown in FIG. 6, and since the HSB converter 620 draws very low current, the intermediate supply voltage buck converter 640 may be integrated on-chip with the buck controller 630 and HSB 620 circuitry. Furthermore Vs2 may be variable or fixed, where a variable voltage allows tracking of different main buck duty cycles. The ratio of Vs2Nload may be chosen to match current slopes, for near perfect harmonic suppression.

The HSB converter 620 may provide zero or near-zero net DC current to the load with a very low RMS current. Because of the low currents, the MOS switches Msai/Msbi-Msam/Msbm may be fully integrated on-chip, comprising integrated driver-MOS switches, as opposed to requiring large off-chip devices. In an example embodiment, the HSB converter 620 may be integrated on-chip with circuitry of the buck controller 630 and the intermediate supply voltage buck converter 640. Some of the devices may be off-chip, such as the inductors Lsup 6031-603M and Lbuck 6051-605N. However, any and all devices may be on-chip, depending on current requirements of the buck converter 600 and space available on the chip.

Figure 7:
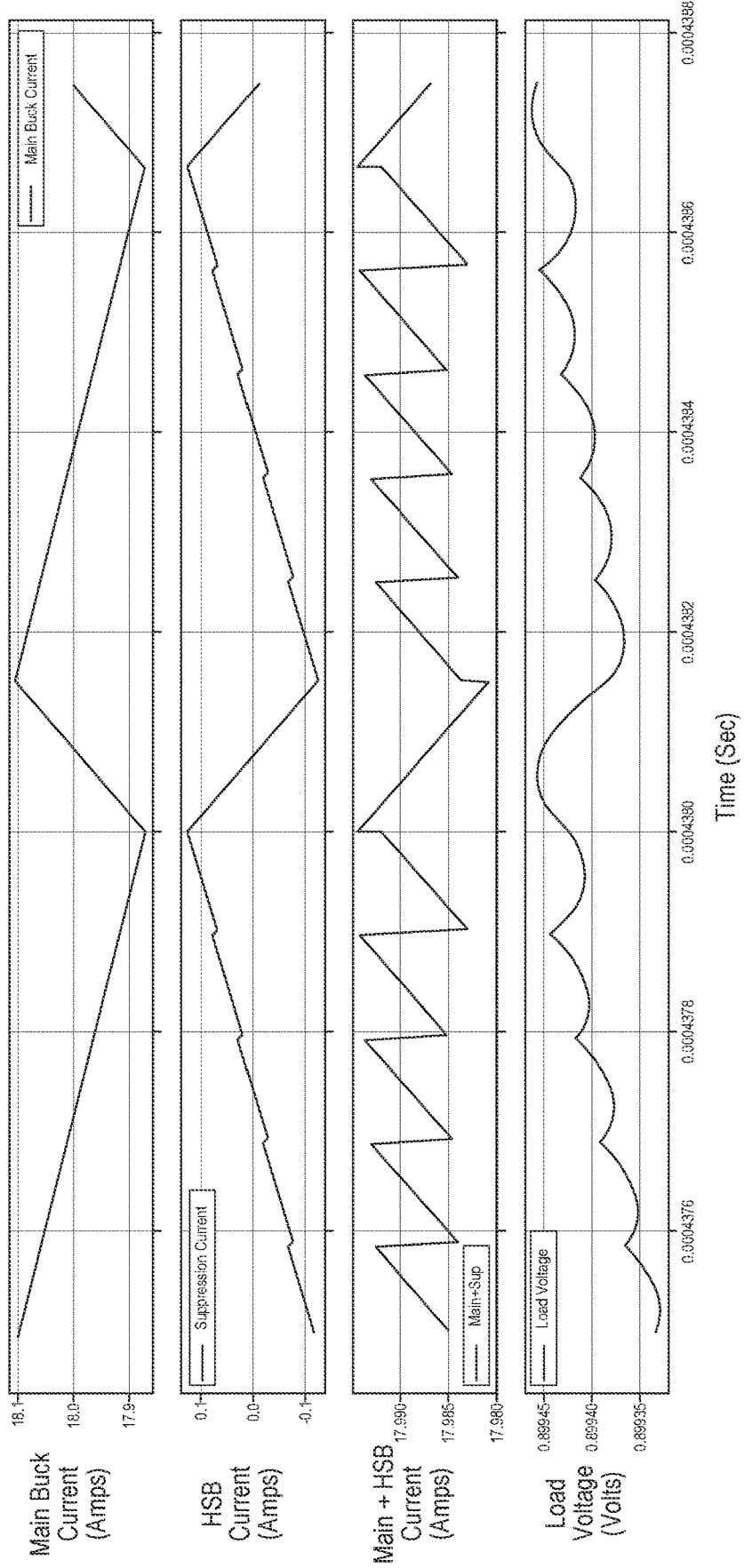
FIG. 7 illustrates various currents and voltages in a multi-phase buck converter with harmonic suppression using an intermediate supply voltage, in accordance with an example embodiment of the disclosure.

FIG. 7 illustrates various currents and voltages in a multi-phase buck converter with harmonic suppression using an intermediate supply voltage, in accordance with an example embodiment of the disclosure. Referring to FIG. 7, there is shown a plot of the main buck converter current, a plot of 5-phase HSB converter current, a plot of the sum of these currents and the resulting load voltage. As can be seen in the main buck current, there is +/−100 mA of variation from the target of 18 Amps. However, the HSB converter plot shows the HSB current closely matches the main buck ripple current, 180 degrees out of phase, so that the resulting ripple is greatly reduced, with only 0.075 mV ripple in the load voltage shown in the lowest plot. In this example, th\e main buck supply voltage Vsource is 12 Volts and the HSB supply voltage Vs2 is 6 Volts.

Figure 8A:
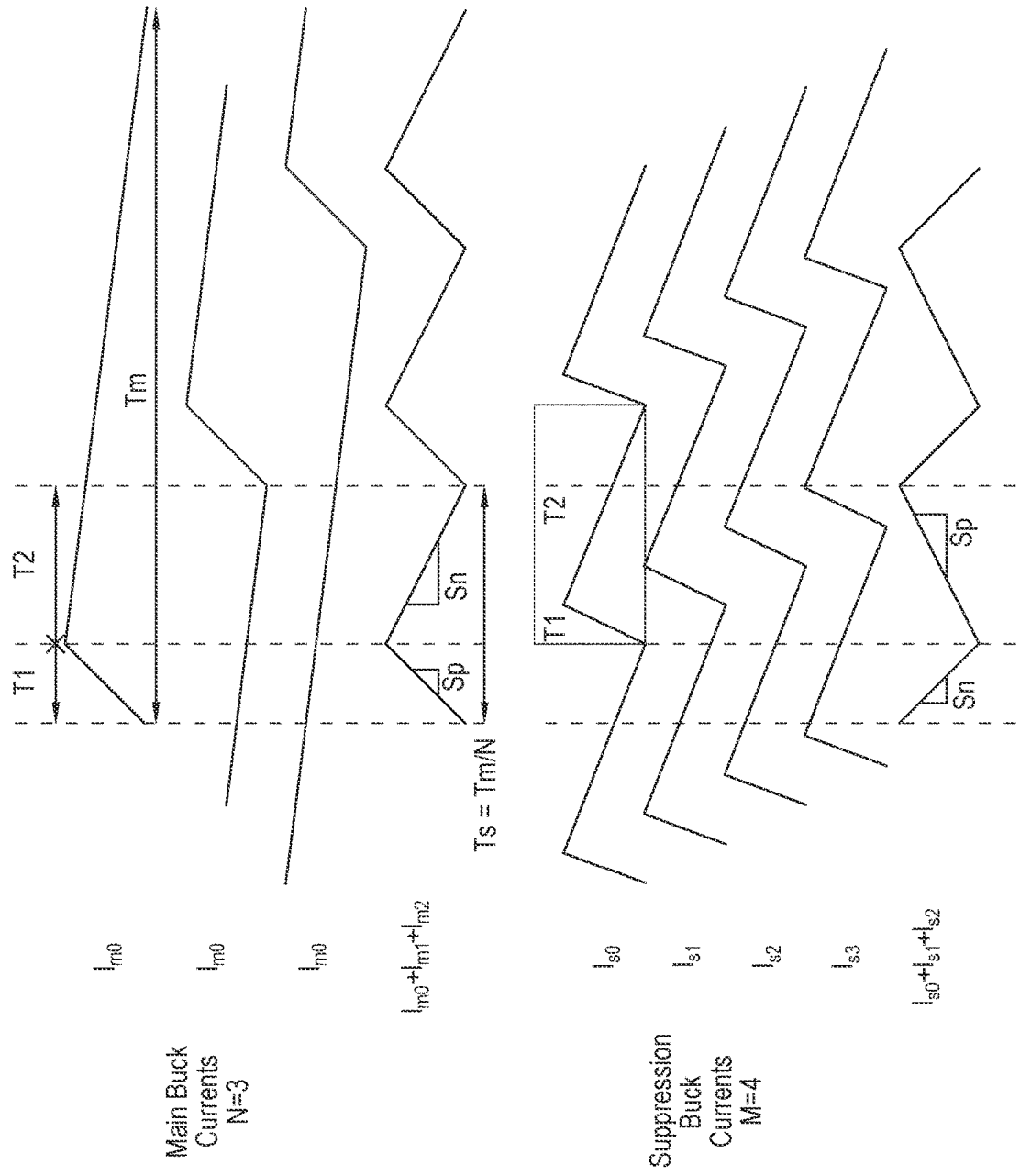
FIG. 8A illustrates current plots for the calculation of currents for ideal current suppression, in accordance with an example embodiment of the disclosure.

FIG. 8A illustrates current plots for the calculation of currents for ideal current suppression, in accordance with an example embodiment of the disclosure. Referring to FIG. 8A, there is shown main buck converter currents in a 3-phase converter and suppression buck converter currents with 4-phases. The following relations may be used to determine duty cycles, as indicated by T1 versus T2, to match amplitude and rising slope:

$$T_1 \cdot S_p = -T_1 \cdot S'_n \rightarrow L_s = \frac{M \cdot V_{load} \cdot L_m}{V_s - N \cdot V_{load}} \quad (1)$$

$$T_2 = \frac{T_m}{N} - T_1$$

Similarly, for matching the falling slope, the following relation may be used:

$$S_n = -S'_p \rightarrow V_{s2} = N \cdot V_{load} \cdot \frac{L_s}{L_m} + M \cdot V_{load} \quad (2)$$

The duty cycles of the main and harmonic suppression buck converters may be set by the voltages by the following relations:

$$\eta_{main} = \frac{V_{load}}{V_{source}} = T_1/T_m$$

$$\eta_{sup} = \frac{V_{load}}{V_{s2}} = T_1'/(T_1' + T_2')$$

$$\text{For } V_{s2} = V_{source}, \quad M = \frac{V_{source}}{V_{load}}, \quad \frac{1}{\frac{N \cdot V_{load}}{V_{source} - N \cdot V_{load}} + 1} \quad (3)$$

These equations assume that the HSB converter high-side phases follow in sequence, with no spacing between and that Vload is approximately constant, "small ripple approximation." The suppression inductance may be set by the integers N and M, the main buck converter inductance Lbuck, and the source and load voltages using equation (1) above. The suppression supply voltage, Vs2, is then set by N, M, both inductances, and the source and load voltages using equation (2) above. Alternatively, for Vs2=Vs, equation (3) sets M, then Lsup is determined using equation (1).

The level of suppression relies on the inductance ratio, so if the inductance ratio is not perfect, the spacing between HSB high-side phases and/or 7/sup can be adjusted to best approximate the ideal suppression waveform, i.e. using least mean squares or some other adaptive algorithm with feedback from the load voltage.

Figure 8B:
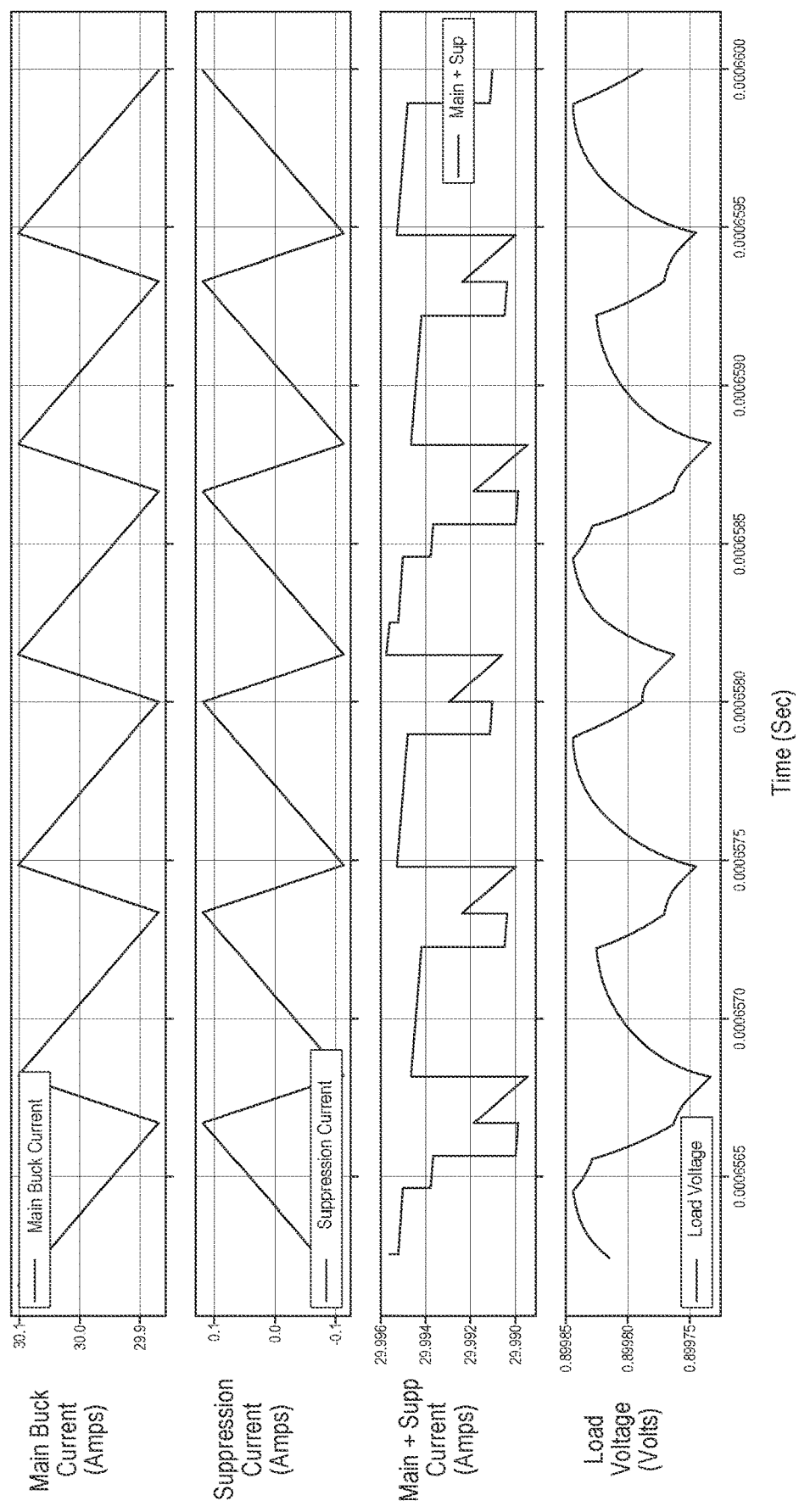
FIG. 8B illustrates various simulated currents and voltages in a multi-phase buck converter with harmonic suppression, in accordance with an example embodiment of the disclosure.

FIG. 8B illustrates various simulated currents and voltages in a multi-phase buck converter with harmonic suppression, in accordance with an example embodiment of the disclosure. Referring to FIG. 8, there is shown a plot of the main buck converter current, a plot of the HSB converter current, a plot of the sum of these currents and the resulting load voltage. As can be seen in the HSB converter current plot, it closely matches the ripple current, 180 degrees out of phase, so that the resulting ripple is greatly reduced. In this example N=3, M=5, Vsource=12 Volts, Vs2=5.82 Volts, and Lsup/Lmain=0.482. The finite switch on-resistance of the MOS devices and variation in Vload introduce deviations from ideal equations. The residual ripple shown in FIG. 8B is limited by the simulation resolution.

Figure 9:
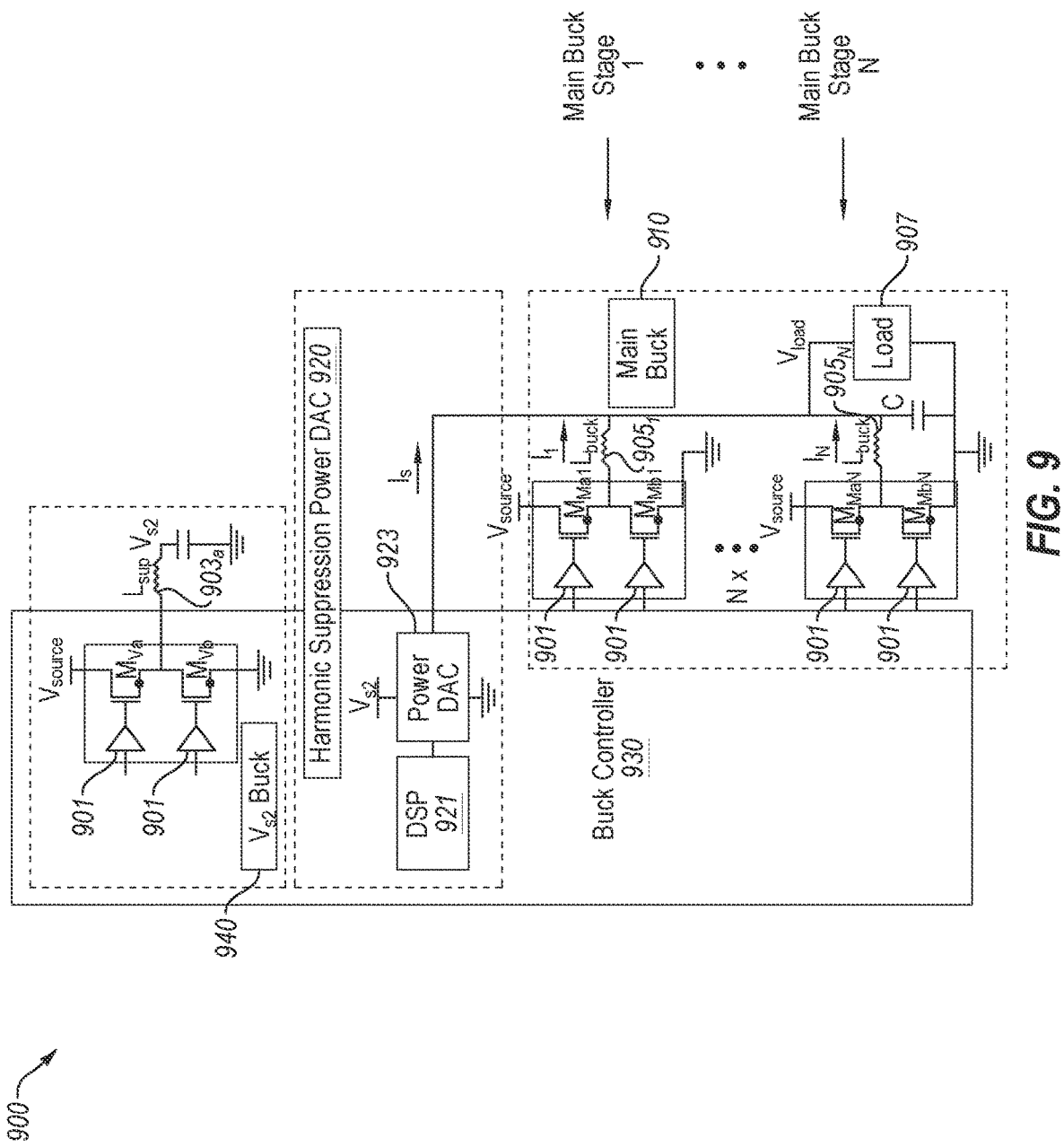
FIG. 9 illustrates a multi-phase buck converter with a power digital-to-analog converter ripple cancellation, in accordance with an example embodiment of the disclosure.

FIG. 9 illustrates a multi-phase buck converter with a power digital-to-analog converter ripple cancellation, in accordance with an example embodiment of the disclosure. Referring to FIG. 9, there is shown multi-phase buck converter 900 comprising a main buck converter 910, a harmonic suppression digital-to-analog converter DAC 920, and an intermediate supply voltage buck converter 940. As described above, the buck converters 910 may comprise a plurality of stages or phases, N phases, for example, with main buck currents I1-IN and suppression DAC current Is. As with the buck converter in FIG. 2, each stage may comprise a pair of switches, NMOS transistors in this example, although other types of switches are possible, and an inductor Lbuck 9051-905N. There is also shown an input stage 901 for each buck converter stage, which provides control signals for each of the switches m-Mal, -Mbl-MMaN/MMbN, and Mva/Mvb. The input stages 901 may comprise clock generators, PLLs, amplifiers, filters, etc. for generating signals to switch each of the transistors Msai/Msbi-Msam/Msbm and MMal/MMbl-MMaN/MMbN on and off.

The main buck converter 910 may comprise a capacitor C that may receive and output charge depending on the voltage across it with respect to Viaad, the output voltage coupled to the load 907. The main buck converter 910 may have a supply voltage Vsource at the drain terminal of transistors M-Mal-MMaN of each pair of the MOS transistors in the converter 910, and the source of transistors MMbl-MMbN of each MOS pair may be coupled to ground, while the remaining source and drain terminals may be coupled together and to the corresponding output inductor, Lbuck 9051-905N. In this example, the harmonic suppression power DAC 920 may have a different intermediate supply voltage, Vs2, coupled to the power DAC 923. A digital signal processor (DSP) 921 in the power DAC 920 may provide a control signal to the power DAC to generate any arbitrary current waveform. The power DAC 923 may comprise a plurality of switched current sources, for example.

In this example, the lower efficiency of the power DAC 923 is traded off against hardware simplicity, as compared to the previously described suppression buck converter phases. The Vs2 buck regulator 940 can be used to produce a lower supply Vs2 to the power DAC 923 to improve system efficiency. The ratio of Vs2/Vload may be chosen to match current slopes, for near perfect harmonic suppression.

Figure 10:
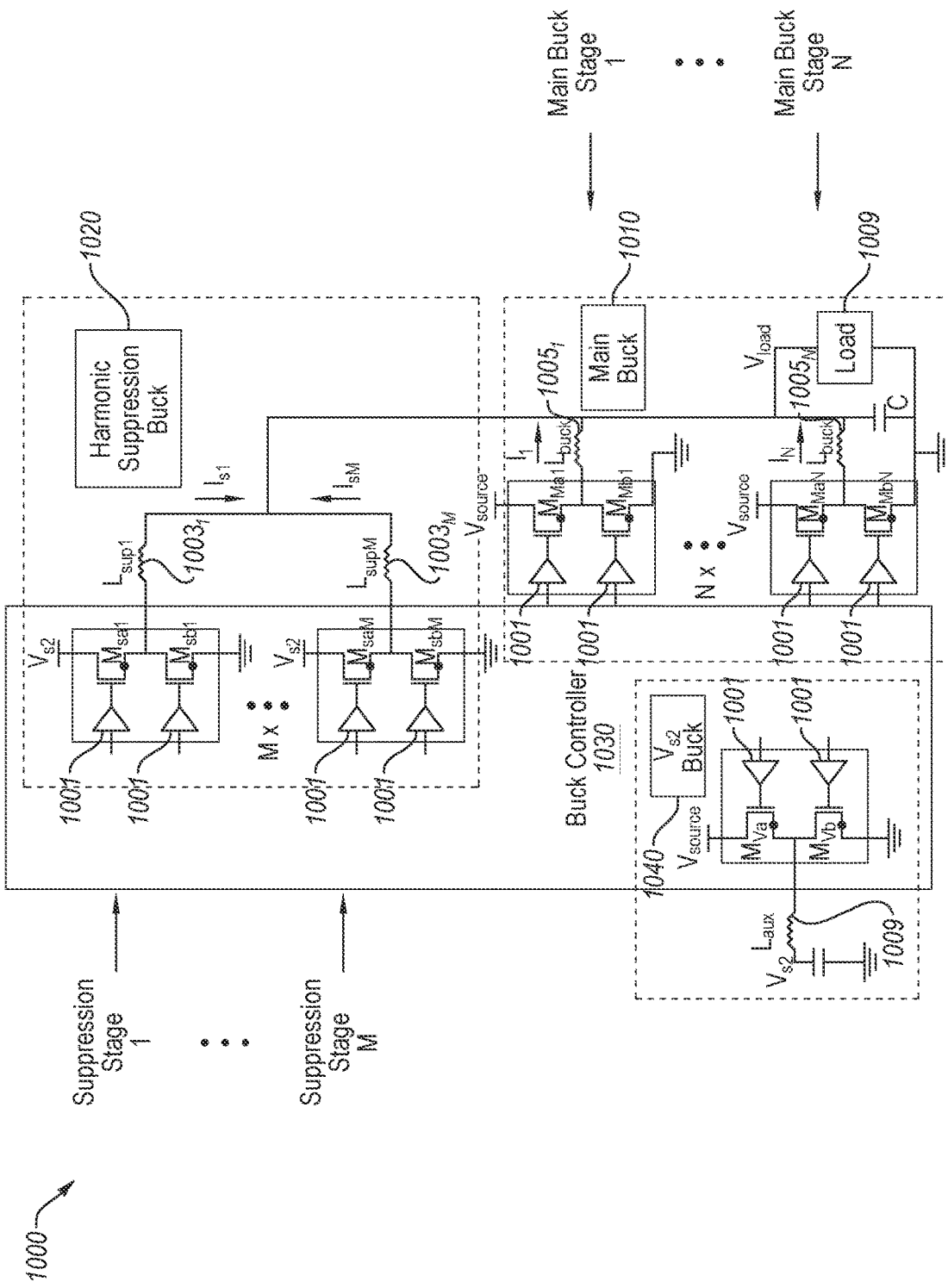
FIG. 10 illustrates a buck converter with harmonic suppression buck converters using non-uniform inductances, in accordance with an example embodiment of the disclosure.

FIG. 10 illustrates a buck converter with harmonic suppression buck converters using non-uniform inductances, in accordance with an example embodiment of the disclosure. Referring to FIG. 10, there is shown a multi-phase buck converter 1000 comprising a main buck converter 1010, a harmonic suppression buck converter 1020, and an intermediate supply voltage buck converter 1040. The buck converters 1010 and 1020 may comprise a plurality of stages or phases, N phases for the main buck converter 1010, and M phases for the harmonic suppression buck converter 1020, for example, with main buck currents I1-IN and suppression buck currents Isi-Ism. As with the buck converters in FIGS. 2 and 6, each stage may comprise a pair of switches, NMOS transistors in this example, although other types of switches are possible, and an inductor Lsup 10031-1003m or Lbuck 10051-1005N. There is also shown an input stage 1001 for each buck converter stage, which provides control signals for each of the switches Msai/Msbi Msam/Msbm and -Malm im, -Mbl-MMaN/MMbN, and Mva/Mvb. The input stages 1001 may comprise clock generators, PLLs, amplifiers, filters, etc. for generating signals to switch each of the transistors Msai/Msbi-Msam/Msbm and MMal/MMbl-MMaN/MMbN on and off.

The main buck converter 1010 may comprise a capacitor C that may receive and output charge depending on the voltage across it with respect to Vioad, the output voltage coupled to the load 1009. The main buck converter 1010 may have a supply voltage Vsource at the drain terminal of transistors m-Mal-MMaN of each pair of the MOS transistors in the converter 1010, and the source of transistors MMbl-MMbN of each MOS pair may be coupled to ground, while the remaining source and drain terminals may be coupled together and to the corresponding output inductor, Lbuck 10051-1005N. In this example, the HSB converter 1020 may have a different intermediate supply voltage, Vs2, coupled to the drain terminals of transistors Msai-Msam of each pair of transistors and the source of the transistors Msbi-Msbm of each MOS pair may be coupled to ground, while the remaining source and drain terminals may be coupled together and to the corresponding output inductor, Lsup-LsupM 10031-1003M. In this example, each phase of the HSB converter 1020 may have a different inductance which allows better slope matching to a nonlinear ripple current. In another example embodiment, the inductances Lsup-LsupM 10031-1003m may be configurable comprising switchable inductors, for example, such as with an array of inductors that may be switched in or out of the current path.

Figure 11:
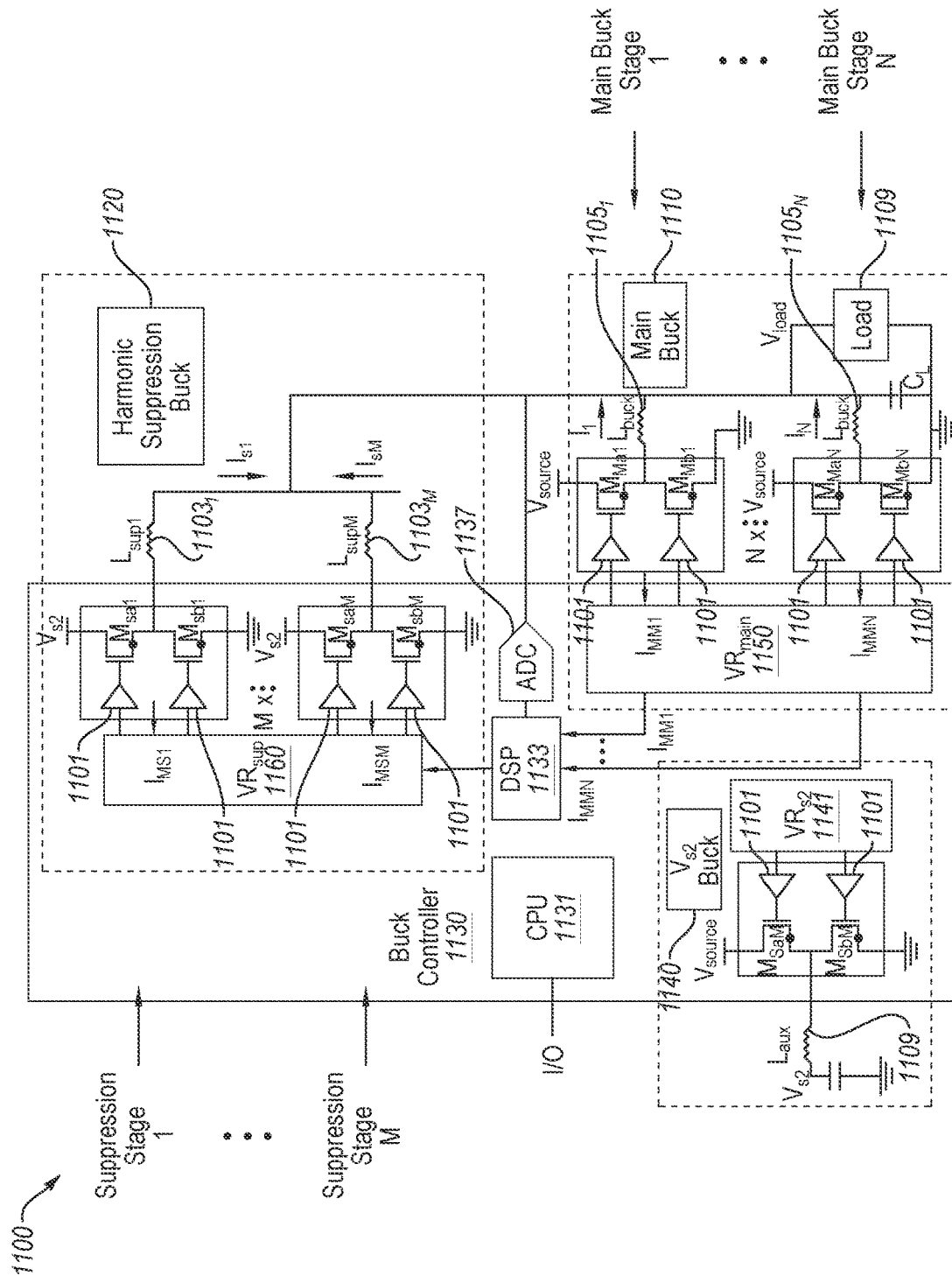
FIG. 11 illustrates a buck converter with harmonic suppression buck converters using trimmed phases, in accordance with an example embodiment of the disclosure.

FIG. 11 illustrates a buck converter with harmonic suppression buck converters using trimmed phases, in accordance with an example embodiment of the disclosure. Referring to FIG. 11, there is shown a multi-phase buck converter 1100 comprising a main buck converter 1110, a harmonic suppression buck converter 1120, a buck controller 1130, and an intermediate supply voltage buck converter 1140. The buck converters 1110 and 1120 may comprise a plurality of stages or phases, N phases for the main buck converter 1110, and M phases for the harmonic suppression buck converter 1120, for example, with main buck currents and suppression buck currents Isi-IsM. The buck controller 1130 may comprise a CPU 1131, digital signal processor (DSP) 1133, analog-to-digital converter (ADC) 1137, and voltage regulation controllers VRmain 1150 and VRsup 1160.

As with the buck converters in FIGS. 2, 6, 9, and 10, each stage may comprise a pair of switches, NMOS transistors in this example, although other types of switches are possible, and an inductor Lsup 11031 1103M or Lbuck 11051-1105N. There is also shown an input stage 1101 for each buck converter stage, which provides control signals for each of the switches Msai/Msbi Msam/Msbm and m-Mal, -Mbl-MMaN/MMbN, and Mva/Mvb. The input stages 1101 may comprise clock generators, PLLs, amplifiers, filters, etc. for generating signals to switch each of the transistors Msai/Msbi-Msam/Msbm and Mmai/MMbi-MMaN/MMbN on and off.

The main buck converter 1110 may comprise a capacitor C that may receive and output charge depending on the voltage across it with respect to Vivad, the output voltage coupled to the load. The main buck converter 1110 may have a supply voltage Vsource at the drain terminal of one of each pair of the MOS transistors in the converter 1110, and the source of the other of each MOS pair may be coupled to ground, while the remaining source and drain terminals may be coupled together and to the corresponding output inductor, Lbuck. In this example, the HSB converter 1120 may have a different intermediate supply voltage, Vs2, coupled to the drain terminals of one of each pair of transistors and the source of the other of each MOS pair may be coupled to ground, while the remaining source and drain terminals may be coupled together and to the corresponding output inductor, Lsup-LsupM. In this example, by using Vs2 to trim duty cycle, this frees up the M phases of the HSB to be used for other purposes. For example, one phase contributes most of the cancellation current. Other phases have binary weighted inductances to trim/adjust the total effective inductance, thereby trimming the HSB ripple current magnitude.

The buck controller 1131 may comprise a CPU 1131, DSP 1133, and ADC 1137, for example, which provides a feedback loop that senses the load voltage and monitors currents for configuring the harmonic suppression buck converter 1120. The CPU 1131 may comprise a general purpose processor or a special purpose processor, or the like. The disclosure, however, is not limited to any particular type of processor. When utilized as a general purpose processor, the CPU 1131 may be operable to, for example, process or handle data, such as the monitor currents Imsi-Imsm and IMM1-IMMN, received from the DSP 1133, and control or manage operations of the buck converter 1100 via the DSP 1133. The ADC 1137 may be operable to monitor the analog output voltage, Vload, of the buck converter 1100, and generate a digital signal to be communicated to the DSP 1133 for controlling the HSB converter 1120.

Multiphase voltage regulator controllers VRsup 1160 and VRmain 1150 drive the buck switching devices in the HBC regulator 1120 and the main buck regulator 1110. The DSP senses load voltage and monitor currents from main buck. The DSP sends control to VRsup and VRs2 to optimize suppression of ripple. The CPU 1131 may communicate via an input/output (I/O) interface for configuring the buck converter 1100.

In operation, a host system controls the buck controller 1130 via the I/O and CPU 1131. In an example scenario, the I/O signal includes commands to increase/decrease voltage (transient voltages), i.e., to change N. The DSP 1133 may control the VR controllers VRsup 1160 and VRmain 1150 to meet transient response requirements. The intermediate voltage Vs2 and number of suppression stages, or phases, M determine how well the HSB converter 1120 cancels main buck 1110 ripple. Different phases may be activated or deactivated based on suppression needs, and may be reduced if Vs2 control reduces the need for more phases, as described above. Furthermore, different phases may be activated based on its output inductance Lsupi-Lsupm 11031-1103m.

The number of suppression phases, M, does not need to increase with the number of main buck phases N, which sets the harmonic frequency at which the suppression buck operates. M can be an independent variable while Lsup and Vs2 may be chosen for minimum ripple using equations (1) and (2) above. In a CPU application, the main buck switches at ~<1 MHz with 8 phases of 60A DC each. Ripple is independent of DC current levels, so the HSB remains low-power and low-complexity. Vivad, N, Vs2, and M may change dynamically for different modes of operation. For example, in low current mode, N may be reduced, and Vs2 & M can adapt to track this. In another mode of operation, M may nominally be equal to 1, and additional HSB phases can be added to effectively trim Lsup, by effectively adding other inductors in shunt with Lsup, for example. The harmonic suppression buck converters described here apply to discontinuous current mode and boost converters as well.

In summary, harmonic currents of an N-phase buck converter can be suppressed to nearly zero. A fully-integrated M-phase harmonic suppression buck minimizes cost and space, reducing or eliminating the need for external components for these phases. An intermediate voltage Vs2 allows optimal cancellation for any given M. A resulting 1-2 orders of magnitude reduction in load voltage ripple with suppression may be enabled. This allows much smaller L and C in the main buck for a given ripple specification, resulting in faster transients, lower cost and area, lower passive losses. Alternatively, a DAC can be used to drive cancellation currents into the load, sacrificing some efficiency.

In an example embodiment of the disclosure, a method and system is described for ripple suppression in multiphase buck converters. The system may comprise a buck converter for providing an output DC voltage with controlled ripple current. The buck converter may comprise one or more main buck converter stages with coupled outputs and one or more harmonic suppression buck converter stages in parallel with the one or more main buck converter stages. The one or more suppression buck converter stages may provide suppression currents at the coupled outputs to cancel ripple currents generated in the one or main buck converter stages.

Each of the one or more main buck converter stages and each of the one or more suppression buck converter stages may comprise a stacked transistor pair with an inductor at an output. A drain terminal of one transistor of each transistor pair in the one or more main buck converter stages may be biased at a first supply voltage. A drain terminal of one transistor of each transistor pair in the one or more suppression buck converter stages may be biased at a second supply voltage. The first supply voltage may be equal to the second supply voltage. The second supply voltage may be generated by a supply voltage buck converter that is biased by the first supply voltage. The second voltage may be less than the first supply voltage. The second voltage may configure the suppression currents. The inductances in the one or more harmonic suppression buck stages may be different for each stage. The inductances in the one or more harmonic suppression buck stages may be configurable.

In another example embodiment, a system is described for ripple suppression in multi-phase buck converters. The system may comprise a buck converter for providing an output DC voltage with controlled ripple current. The buck converter may comprise one or more main buck converter stages with coupled outputs and a harmonic suppression digital-to-analog-converter (DAC) in parallel with the one or more main buck converter stages. The harmonic suppression DAC being may provide suppression current at the coupled outputs to cancel ripple currents generated in the one or main buck converter stages.

One embodiment of the present invention may be implemented as a board level product, as a single chip, application specific integrated circuit (ASIC), or with varying levels integrated on a single chip with other portions of the system as separate components. The degree of integration of the system may primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A system for power control, the system comprising:
a multiphase buck converter for providing an output DC voltage with controlled ripple current, the buck converter comprising:
one or more main buck converter stages; and
one or more suppression buck converter stages coupled with the one or more main buck converter stages, the one or more suppression buck converter stages being operable to provide a suppression current to reduce ripple currents generated in the one or more main buck converter stages, the suppression current being configured by a particular supply voltage,
wherein each of the one or more main buck converter stages and each of the one or more suppression buck converter stages comprises a stacked transistor pair with an inductor at an output.

2. The system of claim 1, wherein a drain terminal of one transistor of each transistor pair in the one or more main buck converter stages is biased at a first supply voltage.

3. The system of claim 1, wherein a drain terminal of one transistor of each transistor pair in the one or more suppression buck converter stages is biased at the particular supply voltage.

4. The system of claim 3, wherein the first supply voltage is equal to the particular supply voltage.

5. The system of claim 3, wherein the particular supply voltage is generated by a supply voltage buck converter that is biased by the first supply voltage.

6. The system of claim 3, wherein the particular voltage is less than the first supply voltage.

7. The system of claim 1, wherein inductances in the one or more suppression buck stages are different for each stage.

8. The system of claim 1, wherein inductances in the one or more suppression buck stages are configurable.

9. A method for power control, comprising:
in a buck converter comprising one or more main buck converter stages and one or more suppression buck converter stages coupled with the one or more main buck converter stages:
providing an output voltage with ripple current, wherein the one or more suppression buck converter stages provides suppression currents to cancel ripple currents generated in the one or main buck converters stages; and
generating a second supply voltage using a supply voltage buck converter that is biased by a first supply voltage, the suppression current being configured by the second supply voltage,
wherein each of the one or more main buck converter stages and each of the one or more suppression buck converter stages comprises a stacked transistor pair with an inductor at an output.

10. The method of claim 9, comprising biasing a drain terminal of one transistor of each transistor pair in the one or more main buck converter stages at the first supply voltage.

11. The method according to claim 9, comprising biasing a drain terminal of one transistor of each transistor pair in the one or more suppression buck converter stages at the second supply voltage.

12. The method of claim 9, wherein the second voltage is less than the first supply voltage.

13. The method of claim 9, wherein the first supply voltage is equal to the second supply voltage.

14. The method of claim 9, wherein inductances in the one or more harmonic suppression buck stages are different for each stage and/or are configurable.

15. A system, comprising:
a buck converter for providing an output voltage with controlled ripple current, the buck converter comprising:
one or more main buck converter stages;
a suppression digital-to-analog-converter (DAC) coupled with the one or more main buck converter stages, the suppression DAC being operable to provide suppression current to reduce ripple currents generated in the one or main buck converter stages, the suppression current being configured by a particular supply voltage; and
a digital signal processor (DSP) operable to provide a control signal to the suppression DAC,
wherein each of the one or more main buck converter stages comprises a stacked transistor pair with an inductor at an output.

16. The system of claim 15, further comprising a supply voltage buck converter that is biased by a first supply voltage.

17. The system of claim 15, wherein a drain terminal of one transistor of each transistor pair in the one or more buck converter stages is biased at the particular supply voltage.

\* \* \* \* \*